(12) United States Patent
Nakamura et al.

(10) Patent No.: US 12,080,511 B2
(45) Date of Patent: Sep. 3, 2024

(54) SAMPLE HOLDER, METHOD FOR USING SAMPLE HOLDER, PROJECTION AMOUNT ADJUSTMENT JIG, PROJECTION AMOUNT ADJUSTMENT METHOD AND CHARGED PARTICLE BEAM DEVICE

(71) Applicant: Hitachi High-Tech Corporation, Tokyo (JP)

(72) Inventors: Megumi Nakamura, Tokyo (JP); Hisayuki Takasu, Tokyo (JP); Kento Horinouchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 349 days.

(21) Appl. No.: 17/754,069

(22) PCT Filed: Sep. 25, 2019

(86) PCT No.: PCT/JP2019/037631
§ 371 (c)(1),
(2) Date: Mar. 23, 2022

(87) PCT Pub. No.: WO2021/059401
PCT Pub. Date: Apr. 1, 2021

(65) Prior Publication Data
US 2022/0319802 A1 Oct. 6, 2022

(51) Int. Cl.
*H01J 37/20* (2006.01)
*H01J 37/09* (2006.01)
(52) U.S. Cl.
CPC .............. *H01J 37/20* (2013.01); *H01J 37/09* (2013.01); *H01J 2237/026* (2013.01); *H01J 2237/20* (2013.01)

(58) Field of Classification Search
CPC ........ H01J 37/09; H01J 37/20; H01J 2237/20; H01J 2237/026; H01J 2237/2007
See application file for complete search history.

(56) References Cited

U.S. PATENT DOCUMENTS

2016/0126057 A1   5/2016  Kaneko et al.
2018/0358201 A1*  12/2018 Negishi .................. H01J 37/20

FOREIGN PATENT DOCUMENTS

JP      2012-154846 A     8/2012
JP       2019-3732 A      1/2019
(Continued)

OTHER PUBLICATIONS

International Search Report (PCT/ISA/210) issued in PCT Application No. PCT/JP2019/037631 dated Dec. 3, 2019 with English translation (two (2) pages).
(Continued)

*Primary Examiner* — David E Smith
(74) *Attorney, Agent, or Firm* — Crowell & Moring LLP

(57) ABSTRACT

A performance of a sample holder 1 used in a charged particle beam device is improved. A shield plate 2 is connected to a sample stand 7. A sample stand 7 is provided with a pressing member 5 that can move in a direction perpendicular to the shield plate 2 in a state in which the pressing member is attached to the sample stand 7, and has a bar shape. A sample supporting member 4 connected to the pressing member 5 is provided at a position facing the shield plate 2. A spring 6 is provided along an outer circumference of the pressing member 5 and is connected to the sample supporting member 4 and the sample stand 7.

14 Claims, 9 Drawing Sheets

(56) References Cited

FOREIGN PATENT DOCUMENTS

KR      2016123080 A  * 10/2016  .............. H01J 37/20
WO   WO 2014/199737 A1   12/2014

OTHER PUBLICATIONS

Japanese-language Written Opinion (PCT/ISA/237) issued in PCT Application No. PCT/JP2019/037631 dated Dec. 3, 2019 (three (3) pages).

* cited by examiner

[FIG. 1]
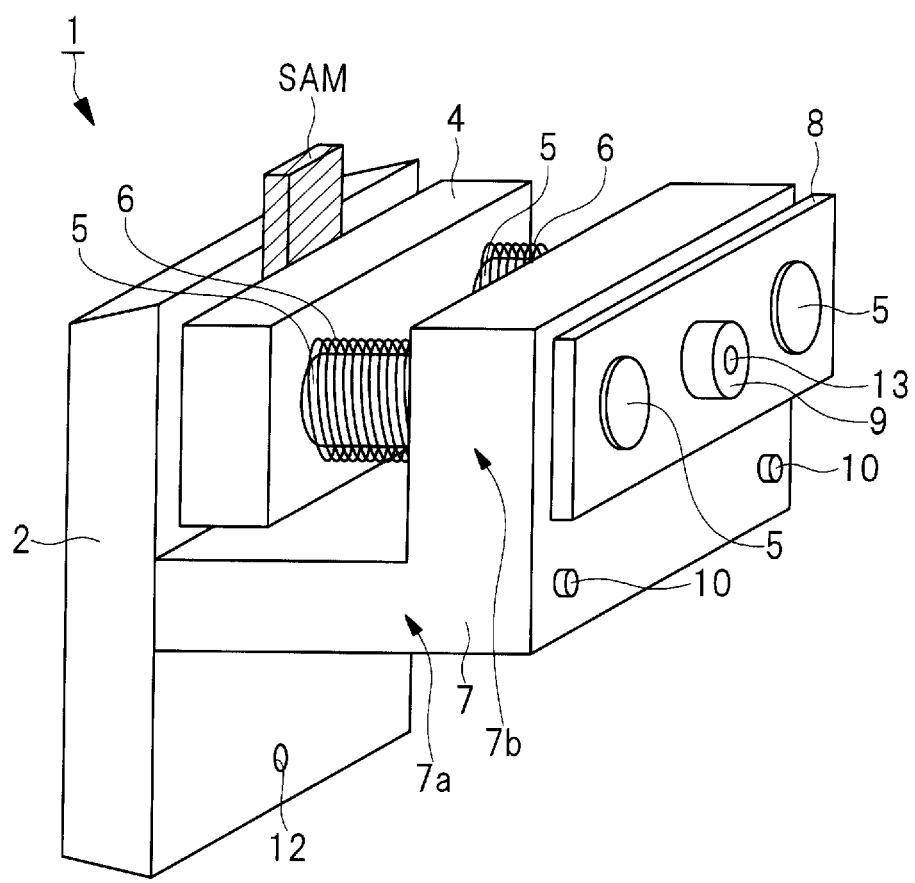

[FIG. 2]
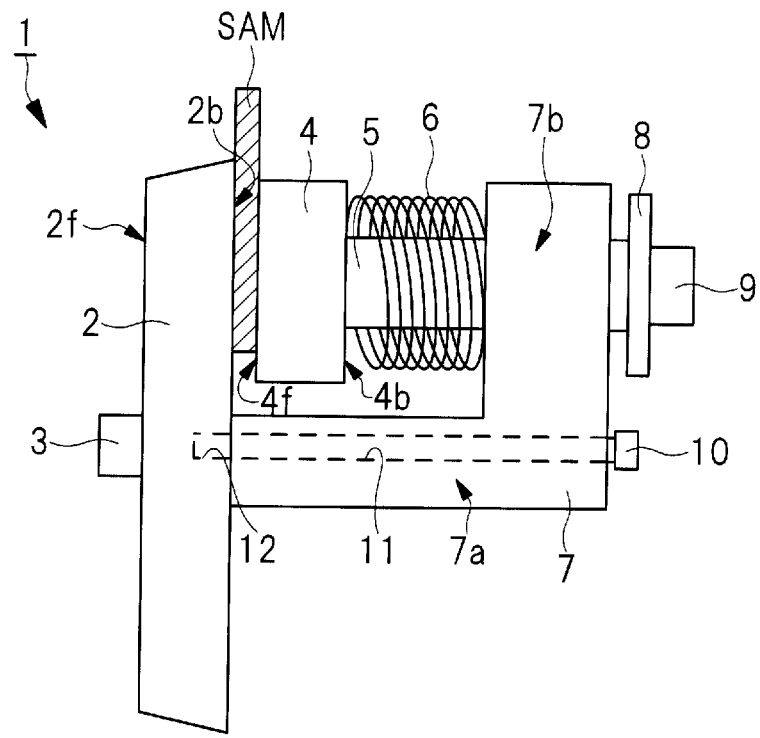
[FIG. 3]
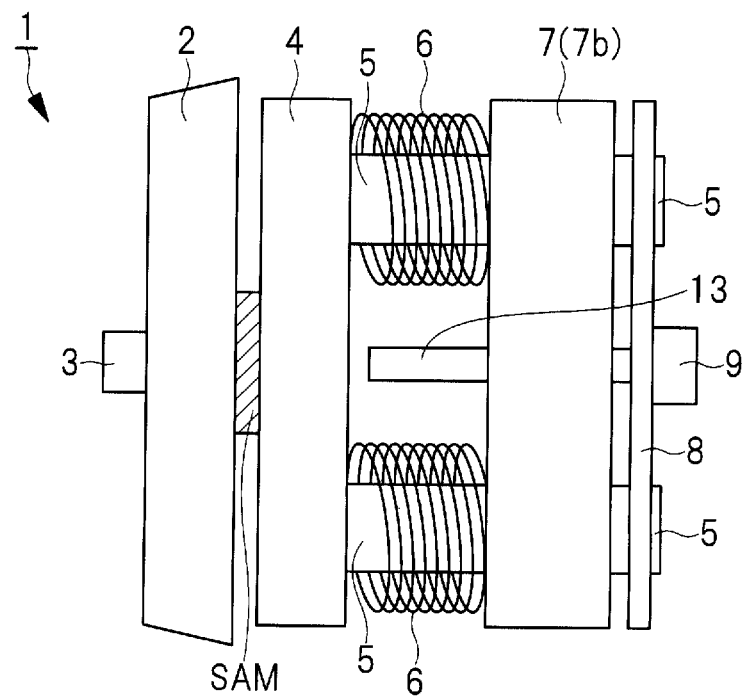

[FIG. 4]
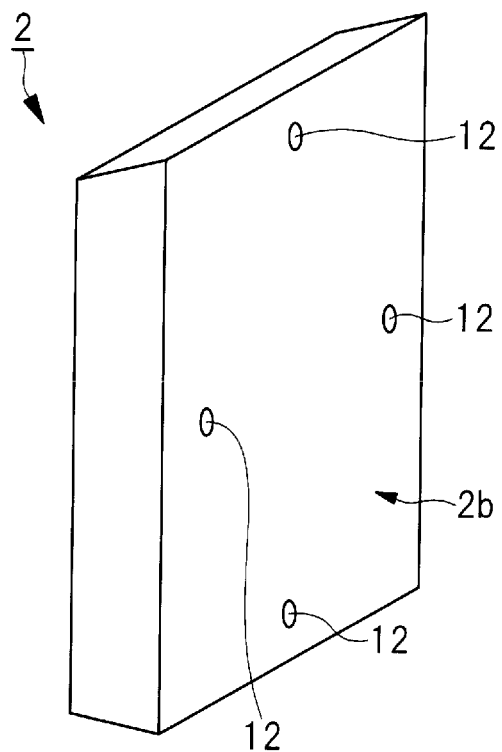
[FIG. 5]
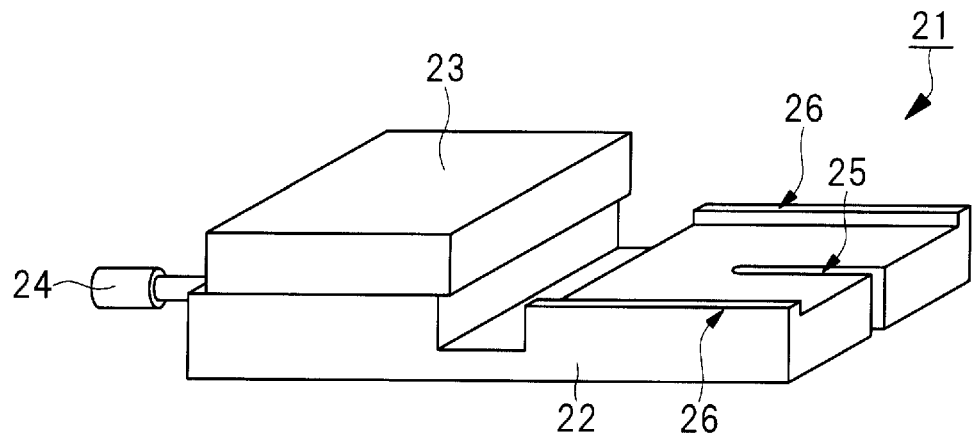

[FIG. 6]
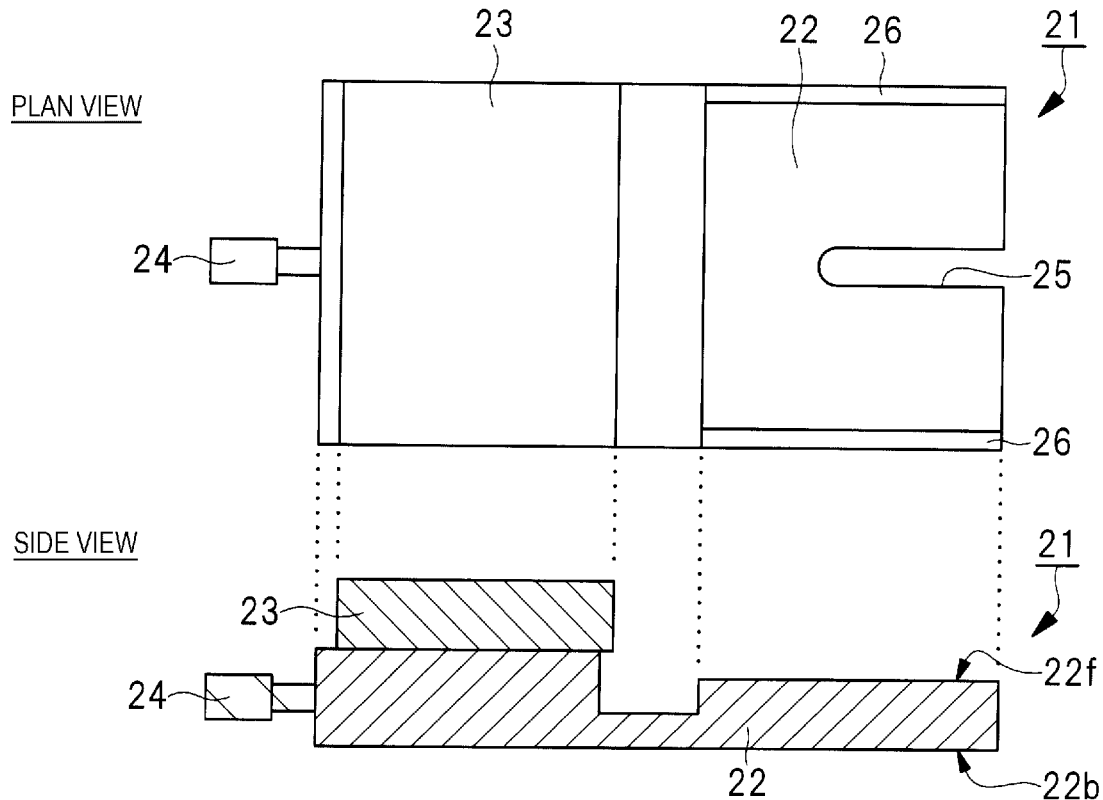
[FIG. 7]
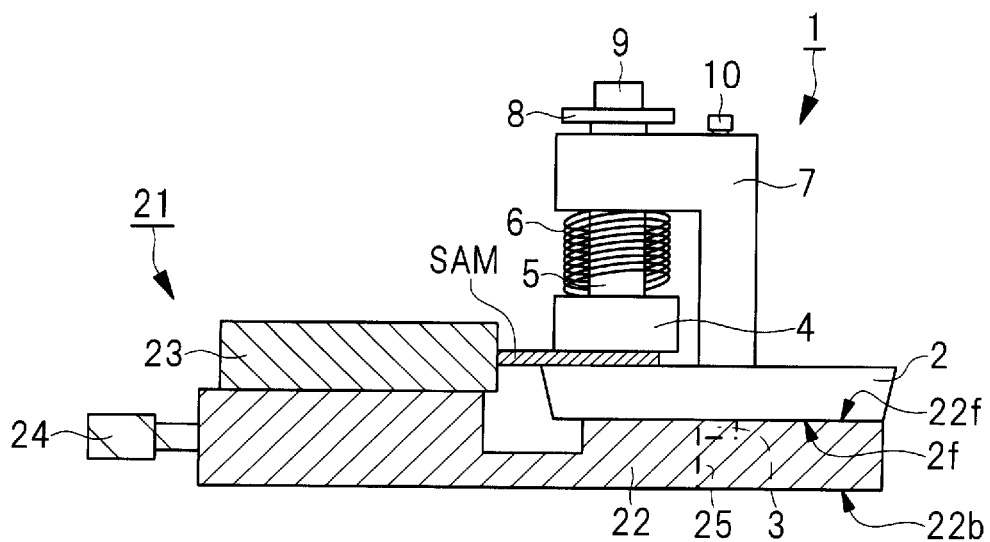

[FIG. 8]
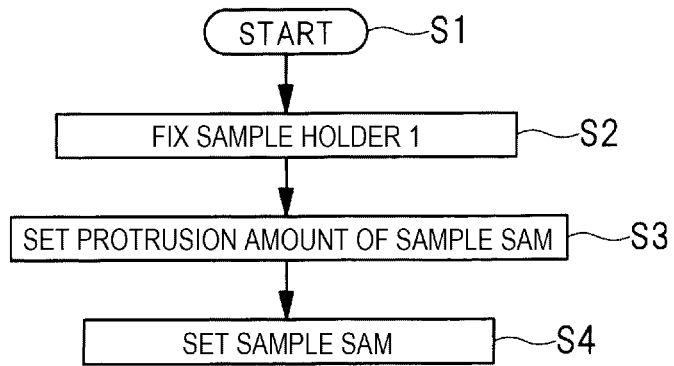
[FIG. 9]
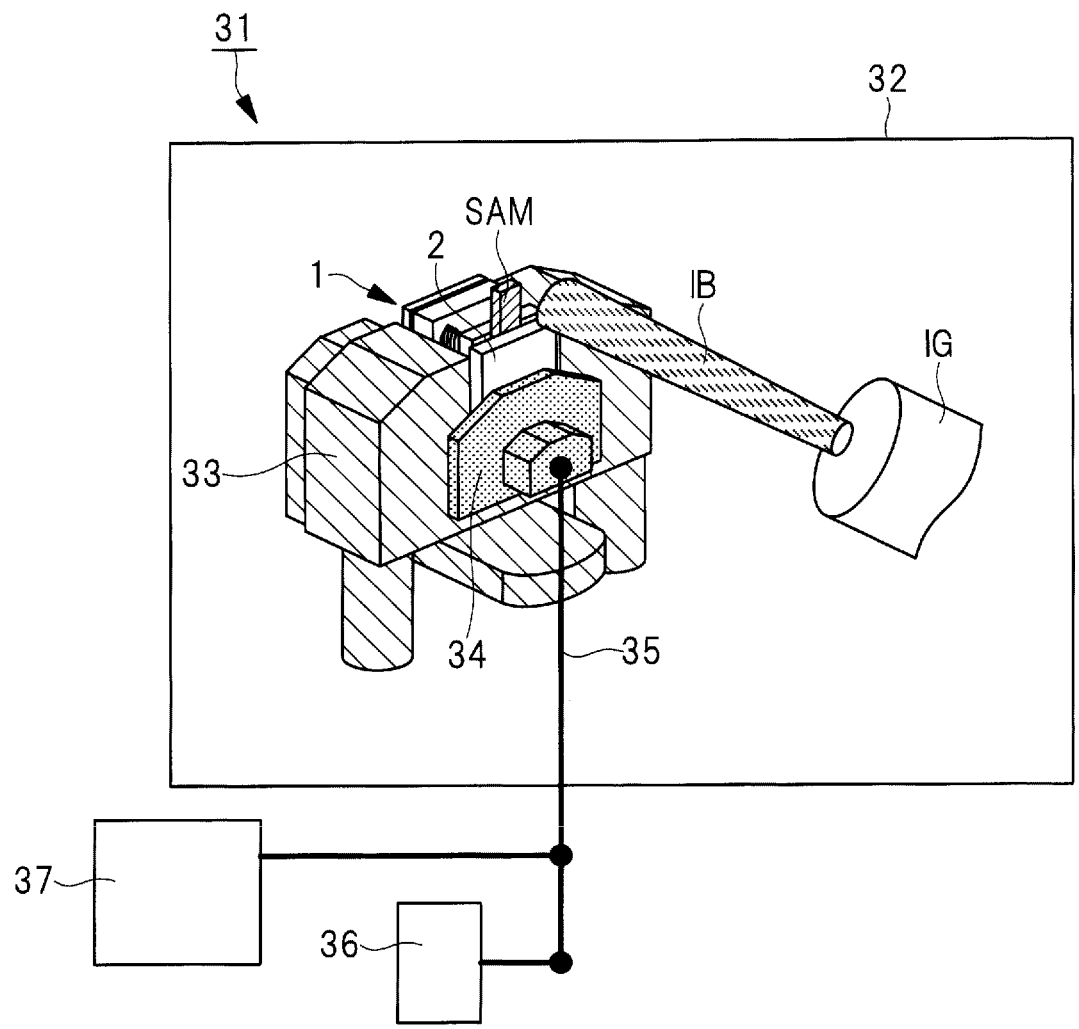

[FIG. 10]
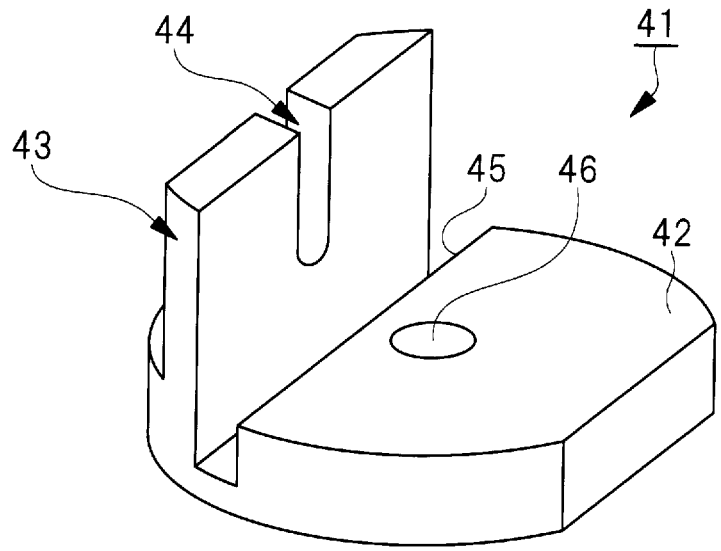
[FIG. 11]
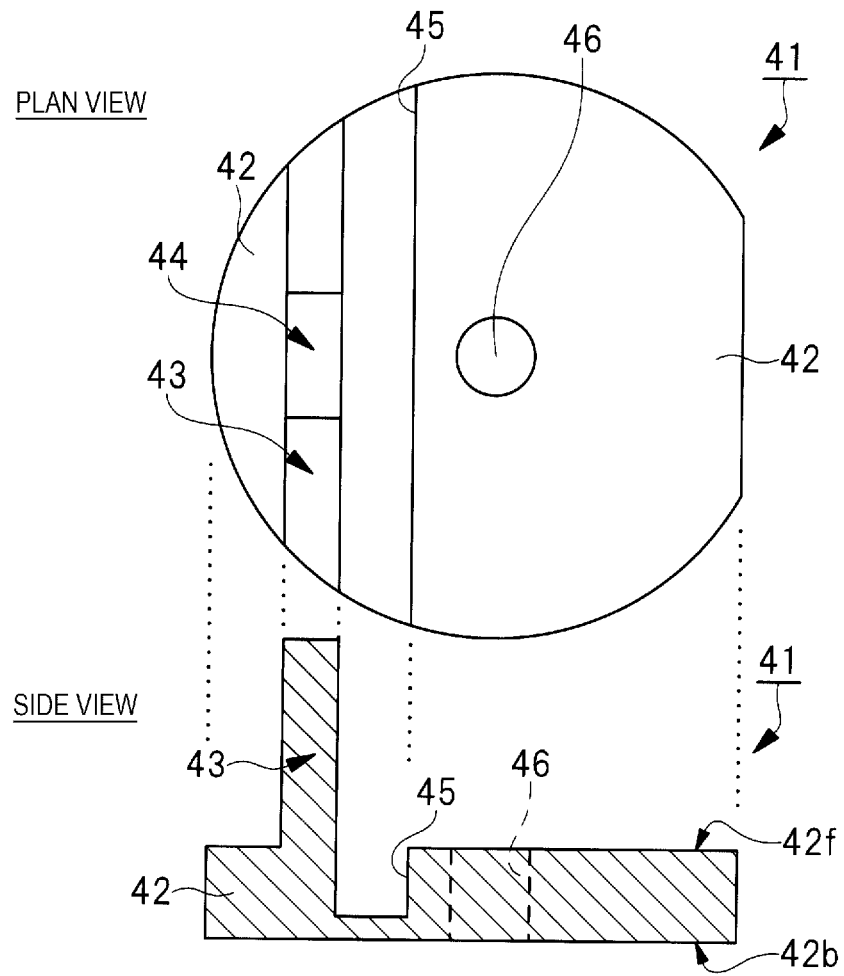

[FIG. 12]
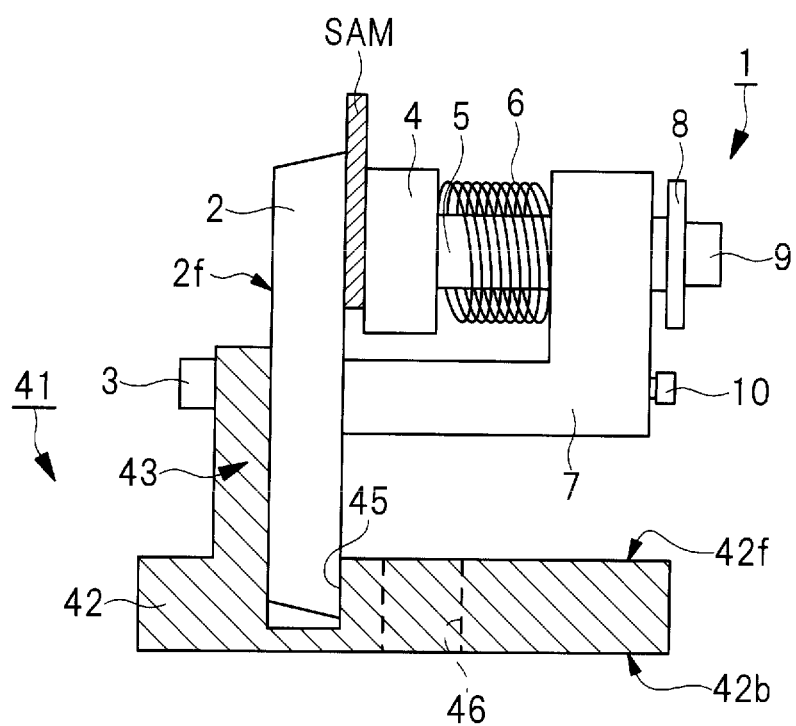

[FIG. 13]
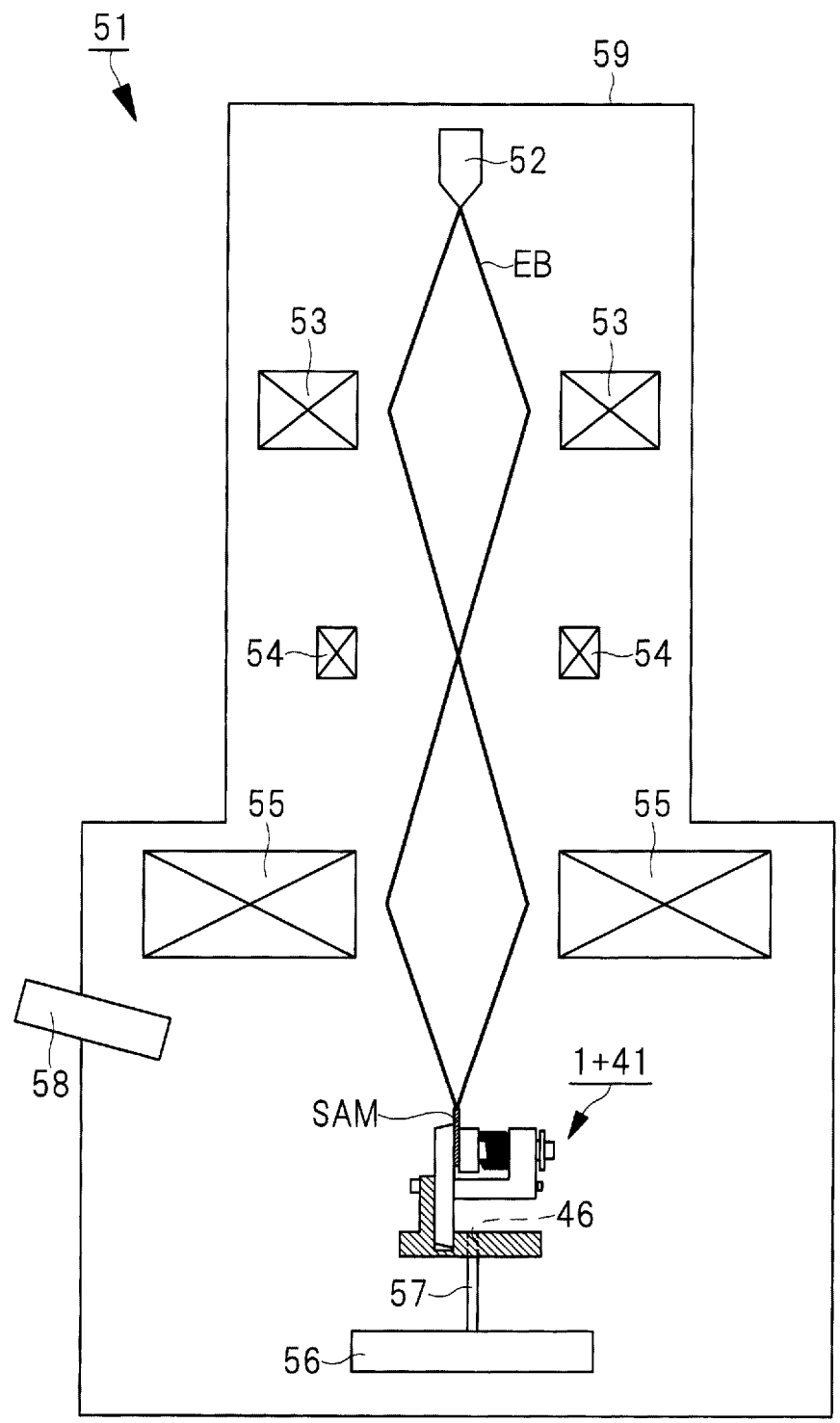

[FIG. 14]
BEFORE COOLING      AFTER COOLING

SAMPLE HOLDER, METHOD FOR USING SAMPLE HOLDER, PROJECTION AMOUNT ADJUSTMENT JIG, PROJECTION AMOUNT ADJUSTMENT METHOD AND CHARGED PARTICLE BEAM DEVICE

TECHNICAL FIELD

The present invention relates to a sample holder, a method of using the sample holder, a protrusion amount adjustment jig for adjusting the protrusion amount of a sample mounted on the sample holder, a method of adjusting the protrusion amount using the protrusion amount adjustment jig, and a charged particle beam device on which the sample holder can be mounted, and particularly, can be preferably used for a sample holder including a shield plate.

BACKGROUND ART

In recent years, a section sample preparation method (ion milling) using an ion beam has been generally used as a method of producing a sample with no stress. In this method, first, a shield plate (mask member) formed of a material having a low sputtering yield is placed on an upper surface of the sample. Next, a part of the sample separated from an end face of the shield plate by about 50 to 200 μm is exposed, and the ion beam is radiated from an upper surface side (shield plate side) of the sample in a vacuum-exhausted sample chamber. By flicking atoms from the upper surface of the sample using a physical sputtering phenomenon, a milling surface with a shape along the end face of the shield plate can be obtained with no stress.

The sample thus obtained is an observation target using, for example, a scanning electron microscope (SEM). Generally, the ion milling for preparing a sample for SEM is often performed under processing conditions of an acceleration voltage of about 10 kV or less and an ion beam current of about 200 μA or less. At this time, an amount of heat to the sample by irradiation with the ion beam is about 2 J/s or less.

However, a half width of the ion milling surface of the sample is about 300 μm, and processing time may exceed several hours, and thus when the ion milling is applied to a sample with a low melting point that is formed of a polymer material or the like, temperature rise of the sample cannot be ignored. In order to prevent the temperature rise, it is necessary to cool the shield plate and the sample. When the sample is cooled and the heat of the sample is dissipated through the shield plate, adhesion between the shield plate and the sample is required.

For example, PTL 1 discloses an ion milling device provided with a moving mechanism for moving a contact surface between a sample mounted on a sample stand and a shield plate following deformation of the sample. PTL 1 also discloses a method of using a sample holding member that is disposed between the shield plate and the sample and deforms following deformation of the sample during irradiation with an ion beam.

CITATION LIST

Patent Literature

PTL 1: WO2014/199737

SUMMARY OF INVENTION

Technical Problem

When a sample formed of a heat-sensitive soft material is cooled by using the ion milling device, it is essential to ensure adhesion between the shield plate and the sample. In the prior art, the shield plate is an accessory of a sample holder for holding the sample, and the shield plate is pressed against the sample side by a screw to bring the shield plate into close contact with the sample.

FIG. 14 is a side view showing a main part of a sample holder of an examination example examined by inventors of this application. Also in the examination example, a shield plate 102 and the sample SAM are brought into close contact with each other. A part of the sample holder is provided with a mask retainer 103 for holding the shield plate 102. The mask retainer 103 is a portion to which a copper wire for transmitting coldness of liquid nitrogen in a Dewar outside a chamber to the shield plate 102 is attached, and is formed of phosphor bronze. The mask retainer 103 has a high thermal conductivity, but has a large contraction due to cooling. As shown in FIG. 14, after cooling, the mask retainer 103 contracts and warps with a mask retainer fixing portion as a support point. Therefore, there is a problem that the adhesion between the sample SAM and the shield plate 102 cannot be ensured.

Examples of an influence on preparation of a section sample caused by the above insufficient adhesion include thermal damage, redeposition, and a change in a protrusion amount of the sample. In the ion milling device provided with a mechanism for cooling the sample by cooling the shield plate, a cooling efficiency is lowered when the adhesion between the shield plate and the sample is insufficient. Since the sample is insufficiently cooled, heat from irradiation with the ion beam accumulates in the sample, and the sample suffers the thermal damage. An example of the damage includes melting of the sample.

Redeposition is a problem that, when adhesion between the shield plate and the sample cannot be ensured, fine particles flicked by irradiation of the sample with argon ions adhere to a gap between the shield plate and the sample.

The change in the protrusion amount is a problem that a shape of the sample changes until a temperature of each of the shield plate and the sample becomes steady due to cooling from a shield plate side and temperature rise caused by the irradiation with the ion beam. Therefore, in particular, in a case of a sample having a high temperature expansion coefficient, a step is generated on a processed surface of the sample. The "protrusion amount" described in this application means an exposure range of the sample irradiated with an ion beam.

In order to solve the above problems, it is important to directly attach the sample to the shield plate and sufficiently ensure the adhesion between the shield plate and the sample. Therefore, a sample holder with a good performance that ensures the above adhesion is desired. Further, for example, a sample holder having a good performance, which ensures the above adhesion even when the shape of the sample is changed during cooling, is desired.

An object of this application is to improve a performance of a sample holder. Another object of this application is to simply adjust a protrusion amount of a sample mounted on the sample holder. Still another object of this application is to improve an accuracy required for a charged particle beam device by including the above sample holder. For example, when the charged particle beam device is an ion milling device, it is an object to process a sample with a high accuracy. When the charged particle beam device is a scanning electron microscope, it is an object to acquire a more accurate observation image.

Other problems and novel features will be apparent from a description of this specification and accompanying drawings.

Solution to Problem

An outline of a representative one of embodiments disclosed in this application will be briefly described as follows.

A sample holder according to an aspect includes: a shield plate that includes a first front surface and a first back surface opposite to the first front surface; a sample stand that is connected to the first back surface of the shield plate; and a pressing member that is configured to move in a first direction perpendicular to the first back surface of the shield plate in a state in which the pressing member is attached to the sample stand, and that has a bar shape. The sample holder includes a sample supporting member that is provided at a position facing the first back surface of the shield plate and is connected to the pressing member, and an elastic body that is provided along an outer circumference of the pressing member and is connected to the sample supporting member and the sample stand.

Advantageous Effect

According to one aspect, a performance of a sample holder can be improved. The protrusion amount of a sample mounted on the sample holder can be simply adjusted. An accuracy required for a charged particle beam device can be improved by including the above sample holder.

BRIEF DESCRIPTION OF DRAWINGS

FIG. 1 is a perspective view showing a sample holder according to a first embodiment.

FIG. 2 is a plan view showing the sample holder according to the first embodiment.

FIG. 3 is a side view showing the sample holder according to the first embodiment.

FIG. 4 is a perspective view showing a shield plate according to the first embodiment.

FIG. 5 is a perspective view showing a protrusion amount adjustment jig according to the first embodiment.

FIG. 6 is a plan view and a side view showing the protrusion amount adjustment jig according to the first embodiment.

FIG. 7 is a side view showing a state in which the sample holder is mounted on the protrusion amount adjustment jig.

FIG. 8 is a flowchart showing a method of adjusting the protrusion amount of a sample.

FIG. 9 is a schematic view showing an ion milling device according to the first embodiment.

FIG. 10 is a perspective view showing an attachment according to the first embodiment.

FIG. 11 is a plan view and a side view showing the attachment according to the first embodiment.

FIG. 12 is a side view showing a state in which the sample holder is mounted on the attachment.

FIG. 13 is a schematic view showing a scanning electron microscope according to the first embodiment.

FIG. 14 is a side view showing a main part of a sample holder in an examination example.

DESCRIPTION OF EMBODIMENTS

Hereinafter, an embodiment will be described in detail with reference to the drawings. In all the drawings for describing the embodiment, members having the same functions are denoted by the same reference numerals, and the repeated description thereof will be omitted. In the following embodiment, the description of the same or similar portion will not be repeated in principle unless necessary.

First Embodiment

<Structure of Sample Holder 1>

The sample holder 1 in the first embodiment will be described below with reference to FIGS. 1 to 4. The sample holder 1 is preferably used for a charged particle beam device such as an ion milling device or a scanning electron microscope. FIGS. 1 to 3 are a perspective view, a side view, and a plan view showing the sample holder 1. FIG. 4 is a perspective view for illustrating a screw hole 12 of a shield plate 2.

As shown in FIGS. 1 to 3, the sample holder 1 includes the shield plate (mask member) 2, a fixing screw 3, a sample supporting member 4, pressing members 5, springs (elastic bodies) 6, a sample stand 7 that is a supporting member of the pressing members 5 or the like, a plate 8, a knob 9, fixing screws 10, and a fixing screw 13. These members are each formed of a non-magnetic material.

The shield plate 2 is a plate having four sides tapered by about 50 μm. The shield plate 2 has a front surface 2f having a relatively small surface area, and a back surface 2b that is a surface opposite to the front surface 2f and has a surface area larger than that of the front surface 2f. Each of four side surfaces has a trapezoidal shape. A screw hole for attaching the fixing screw 3 is formed in a central portion of the shield plate 2, and the fixing screw 3 is screwed to the shield plate 2 on a front surface 2f side.

The sample supporting member 4 is provided at a position facing the back surface 2b of the shield plate 2, and is connected to the pressing member 5. The sample supporting member 4 includes a front surface 4f and a back surface 4b that is a surface opposite to the front surface 4f, and the front surface 4f faces the back surface 2b of the shield plate 2. A width of the sample supporting member 4 is about the same as a width of the shield plate 2 (a length of a side of the back surface 2b). A sample SAM is fixed between the sample supporting member 4 and the shield plate 2. That is, the sample SAM is sandwiched between the sample supporting member 4 and the shield plate 2 in a manner of being in contact with the front surface 4f of the sample supporting member 4 and the back surface 2b of the shield plate 2.

The pressing member 5 having a bar shape can move in a direction perpendicular to the back surface 2b of the shield plate 2 in a state in which the pressing member 5 is attached to the sample stand 7. Specifically, the pressing member 5 penetrates a pressing member connection portion 7b of the sample stand 7 and is connected to the sample supporting member 4 and the plate 8. One end portion of the pressing member 5 is connected to the sample supporting member 4, and the other end portion of the pressing member 5 penetrates the sample stand 7 and is connected to the plate 8. In FIG. 1, the pressing member 5 having the bar shape is a cylinder, but the pressing member 5 is not limited to the cylinder, and may be a polygonal prism.

As shown in FIG. 3, two pressing members 5 are provided, and are provided at positions that are line-symmetrical or point-symmetrical with respect to a central portion of the sample supporting member 4. In other words, the two pressing members 5 are provided at positions that are line-symmetrical with respect to the central portion of the shield plate 2 (a central portion of the fixing screw 3). The two pressing members 5 are positioned as described above, and thus pressures applied to the sample supporting member 4 are in equilibrium, and a pressure for holding the sample SAM is made uniform on a contact surface between the sample supporting member 4 and the sample SAM.

The sample stand 7 includes a shield plate connection portion 7a extending in a direction in which the pressing member 5 extends, and a pressing member connection portion 7b extending in a direction intersecting the shield plate connection portion 7a. In other words, the shield plate connection portion 7a extends in a direction perpendicular to the back surface 2b of the shield plate 2 and is connected to the shield plate 2. The pressing member connection portion 7b extends in a direction parallel to the back surface 2b of the shield plate 2 and is connected to the pressing member 5 and the spring 6.

The spring 6 is a kind of elastic body that can expand and contract due to an external stress, and is provided along an outer circumference of the pressing member 5 and connected to the sample supporting member 4 and the sample stand 7. In other words, the spring 6 is spirally provided to wind around the pressing member 5, and the pressing member 5 passes through an inner diameter of the spring 6. One end portion of the spring 6 is connected to the sample supporting member 4, and the other end portion of the spring 6 is connected to the pressing member connection portion 7b of the sample stand 7. Here, two springs 6 are respectively provided on outer circumferences of the two pressing members 5, and are provided at positions that are line-symmetrical or point-symmetrical with respect to the central portion of the sample supporting member 4, similarly to the two pressing members 5.

A part of the plate 8 forms the knob 9 with a cylindrical shape that is positioned at a central portion of the plate 8. The knob 9 is pulled or pressed, so that a position of the sample supporting member 4 can be changed. That is, when the knob 9 is moved in a direction perpendicular to the back surface 2b of the shield plate 2, the sample supporting member 4, the pressing member 5, the spring 6, and the plate 8 move together in a moving direction of the knob 9.

The fixing screw 13 is provided on a central portion of the knob 9, penetrates the plate 8 and the sample stand 7 (pressing member connection portion 7b), and has a length at which the fixing screw 13 can come into contact with the sample supporting member 4. The sample supporting member 4 is fixed by not only the pressing member 5 but also the fixing screw 13. Since the sample supporting member 4 can be fixed by the fixing screw 13, the position of the sample supporting member 4 can be prevented from being displaced due to an impact or the like.

As shown in FIG. 4, a screw hole 12 for the fixing screw 10 is formed in a central portion of each of four sides constituting the back surface 2b of the shield plate 2. Two screw holes 12 provided point-symmetrically with respect to the central portion of the back surface 2b of the shield plate 2 are used for connecting the shield plate 2 and the sample stand 7. As can be seen from FIGS. 1 and 2, two screw holes 11 are formed in the shield plate connection portion 7a of the sample stand 7, and the positions of the two screw holes 11 are adjusted to communicate with two screw holes 12 provided point-symmetrically. Each of the fixing screws 10 is inserted into the screw hole 11 and the screw hole 12 that communicate with each other, so that the sample stand 7 is connected to the shield plate 2, and the sample stand 7 and the shield plate 2 are integrated.

The shield plate 2 is rotated by 90 degrees, and the other two screw holes 12 are used, so that the sample stand 7 can also be fixed to the shield plate 2. In this way, by rotating the shield plate 2 to a predetermined position, a side from which the sample SAM protrudes can be appropriately changed. Therefore, all of the four sides of the shield plate 2 can be utilized for ion milling. When the damage to a certain side of the shield plate 2 is conspicuous due to the ion milling, it may be changed to another side. Since each side can be used for ion milling of several times, costs for replacing the shield plate 2 with a new shield plate 2 can be reduced.

As described above, according to the first embodiment, the sample holder 1 capable of holding the sample SAM can be provided, and such a sample holder 1 can be preferably used for various charged particle beam devices.

For example, as described above, when the sample holder 1 is used for the ion milling, it is essential to cool the shield plate 2 to contact the sample SAM in order to prevent the temperature of the sample SAM from rising due to ion beam radiation. In a case of an examination example as illustrated in FIG. 14, when a mask retainer contracts, the shield plate 2 warps in a direction away from the sample SAM with a mask retainer fixing portion as a support point, and thus there is a problem that adhesion cannot be ensured. As a result, a cooling efficiency of the sample SAM decreases, and thermal damage, redeposition, and a change in the protrusion amount may occur.

In contrast, in the first embodiment, the shield plate 2 and the sample stand 7 are connected and integrated, and thus a defect that the shield plate 2 is separated from the sample SAM can be reduced, and the adhesion between the sample SAM and the shield plate 2 can be ensured. Therefore, it is possible to provide the sample holder 1 with a good performance that can solve the above problems.

The sample SAM is pressed against the shield plate 2 by a static stress and a dynamic stress through the sample supporting member 4. In the first embodiment, the static stress is a stress generated by the pressing member 5 and the fixing screw 13, and the dynamic stress is a stress generated by the spring 6. For example, even when the sample SAM has a shape change due to contraction or expansion, the spring 6 can follow a slight movement due to the shape change and maintain a state in which the sample SAM is pressed against the shield plate 2. Therefore, the adhesion between the sample SAM and the shield plate 2 can be further ensured.

The members constituting the sample holder 1 are each formed of a non-magnetic material. The shield plate 2 is formed of, for example, titanium (Ti) or tungsten carbide (WC). The fixing screw 3, the sample supporting member 4, the pressing members 5, the sample stand 7, the plate 8 including the knob 9, the fixing screws 10 and the fixing screw 13 are formed of, for example, stainless steel such as SUS316 or SUS316L. The spring 6 is formed of, for example, phosphor bronze.

For example, when the sample holder 1 is used for the scanning electron microscope, and the members of the sample holder 1 each contain a magnetic material, a magnetic field is generated during observation, which hinders the acquisition of an accurate observation image. When the members are formed of the non-magnetic material, the influence of the magnetic field during observation is reduced, so that a more accurate observation image can be obtained.

<Structure of Protrusion Amount Adjustment Jig and Method of Adjusting Protrusion Amount>

FIG. 5 is a perspective view showing a protrusion amount adjustment jig 21, FIG. 6 shows a plan view and a side view showing the protrusion amount adjustment jig 21, and FIG. 7 is a side view showing a state in which the sample holder 1 is installed on the protrusion amount adjustment jig 21. The sample holder 1 can be mounted on the protrusion amount adjustment jig 21, and the protrusion amount adjustment jig 21 is used to adjust a protrusion amount of the sample SAM.

As shown in FIGS. 5 to 7, the protrusion amount adjustment jig 21 includes a shield plate installation stand 22, a slider 23, and a micrometer (a moving mechanism) 24, and these components are integrated.

The shield plate installation stand 22 includes a front surface 22f and a back surface 22b opposite to the front surface 22f. The shield plate installation stand 22 is provided with a notch 25 penetrating from the front surface 22f to the back surface 22b, and two edges 26 slightly protruding from the front surface 22f on which the notch 25 is formed. The notch 25 is used to fix the shield plate 2 using the fixing screw 3, and widths of the two edges 26 are matched with a width of the shield plate 2. The shield plate installation stand 22 has a thickness at which the fixing screw 3 can be fixed.

The slider 23 is a plate, and is provided on the front surface 22f of the shield plate installation stand 22 and attached to the shield plate installation stand 22. An end face of the slider 23 faces an end face of each of the shield plate 2 and the sample supporting member 4, and can come into close contact with an end face of the shield plate 2. When the sample SAM is mounted, the end face of the slider 23 comes into close contact with the end face of the sample SAM. A thickness of the slider 23 is larger than a thickness of the sample SAM, and is a thickness at which the slider 23 can come into close contact with the sample SAM and the shield plate 2.

A micrometer 24 is connected to the shield plate installation stand 22 as a moving mechanism of the slider 23. By rotating the micrometer 24, a position of the slider 23 can be moved in a horizontal direction. For example, when the micrometer 24 is rotated clockwise, the slider 23 moves in a direction approaching the shield plate 2, and when the micrometer 24 is rotated counterclockwise, the slider 23 moves in a direction away from the shield plate 2.

FIG. 8 is a flowchart showing a method of adjusting the protrusion amount of the sample SAM, and the method of adjusting the protrusion amount includes steps S1 to S4 described below.

<<Step S1>>

First, as a preparation for starting the adjustment, the micrometer 24 provided in the protrusion amount adjustment jig 21 is rotated to adjust a scale of the micrometer 24 to zero (0).

<<Step S2>>

The sample holder 1 is fixed to the shield plate installation stand 22. For example, the sample holder 1 is mounted on the front surface 22f of the shield plate installation stand 22 along the edges 26 such that the front surface 2f of the shield plate 2 is in contact with the front surface 22f of the shield plate installation stand 22 and the sample supporting member 4 is positioned on a slider 23 side. The shield plate 2 is fixed to the shield plate installation stand 22 by inserting the fixing screw 3 into the notch 25 from a back surface 22b side of the shield plate installation stand 22. The end face of the shield plate 2 is in close contact with the end face of the slider 23.

<<Step S3>>

The protrusion amount of the sample SAM is set. Since the slider 23 moves in a direction away from the shield plate 2 by rotating the micrometer 24 counterclockwise, a distance from the shield plate 2 to the slider 23 is adjusted. That is, a distance between the shield plate 2 and the slider 23 is adjusted by moving the slider 23 using the micrometer 24. The distance is defined as the protrusion amount of the sample SAM. In other words, an exposure amount of the sample SAM that is not covered with the shield plate 2 and is exposed from the shield plate 2 is defined as the above protrusion amount.

<<Step S4>>

The sample SAM is set on the shield plate installation stand 22 on which the sample holder 1 is mounted. First, the knob 9 is lifted, and the sample supporting member 4 or the like is moved in the direction away from the shield plate 2. Next, in a state in which the sample supporting member 4 is separated from the shield plate 2, the sample SAM is placed between the sample supporting member 4 and the shield plate 2. Next, by bringing the end face of the sample SAM into contact with the end face of the slider 23, a part of the sample SAM is exposed (protrudes) from the shield plate 2. Next, the knob 9 is gently lowered, the sample supporting member 4 is moved so that the sample supporting member 4 comes into contact with the sample SAM, and the sample SAM is held between the sample supporting member 4 and the shield plate 2. Thereafter, the fixing screw 13 is rotated to bring the fixing screw 13 into contact with the sample supporting member 4, thereby fixing the sample supporting member 4.

For example, in the examination example as shown in FIG. 14, it is necessary to adjust a relative position with a micrometer in a state in which the sample SAM and the shield plate 2 are fixed to the sample holder 1. Therefore, adjustments of a parallel position and an adhesion degree of the sample SAM and the shield plate 2 and an adjustment of the protrusion amount are performed under observation using an optical microscope. Therefore, a process of mounting the sample SAM is complicated.

In contrast, in the first embodiment, adjustments can be performed by using the protrusion amount adjustment jig 21 without using the optical microscope. Although not shown, the sample holder 1 and the protrusion amount adjustment jig 21 can be installed inside a glove box (sealed container), and the above steps S1 to S4 can be performed inside the glove box. That is, the sample SAM can also be mounted on the sample holder 1 by adjusting the protrusion amount of the sample SAM inside the glove box. Therefore, the protrusion amount can be adjusted more simply than in the examination example when the protrusion amount adjustment jig 21 according to the first embodiment is used. That is, the process of mounting the sample SAM can be facilitated, and the number of processes can be reduced.

<Application to Ion Milling Device>

FIG. 9 is a schematic view showing an ion milling device (charged particle beam device) 31 including the sample holder 1.

As shown in FIG. 9, the ion milling device 31 includes an ion gun IG, a processing holder 33, and a cooling plate 34 inside a chamber (sample chamber) 32, and includes a cooling mechanism 36 and a control unit 37 outside the chamber 32.

The processing holder 33 can hold the sample holder 1, and the shield plate 2 is fixed to the processing holder 33 by the fixing screw 3 or the like. As illustrated with reference to FIG. 8, the sample SAM whose protrusion amount is adjusted by using the protrusion amount adjustment jig 21 is mounted on the sample holder 1. The protrusion amount of the sample SAM is adjusted within a range of, for example, 10 μm to 100 μm.

The processing holder 33 is provided with the cooling plate 34 to be in direct contact with the front surface 2f of the shield plate 2. The cooling plate 34 is connected to the cooling mechanism 36 and the control unit 37 via a braided wire 35. The braided wire 35 includes, for example, a plurality of copper wires, and the plurality of copper wires are each formed of phosphor bronze. The cooling mechanism 36 is, for example, liquid nitrogen charged into the inside of a Dewar. The shield plate 2 is connected to the cooling mechanism 36 via the cooling plate 34 and the braided wire 35, so that the sample SAM in close contact with the shield plate 2 is cooled.

Although not shown here, a heater capable of heating the cooling plate 34 is provided between the cooling plate 34 and the control unit 37. The temperature of the above cooling plate 34 is set to a desired temperature by monitoring the temperature of the cooling plate 34 cooled by the cooling mechanism 36 and appropriately adjusting the temperature of the above heater in the control unit 37. Therefore, the sample SAM can be set to a predetermined temperature.

In the ion milling device 31 according to the first embodiment, section milling can be performed using the sample holder 1. In the section milling, a section of the sample SAM formed of various materials such as a metal, a metal compound, an inorganic insulating film, or an organic insulating film containing a polymer material is prepared. During the ion milling, in the vacuum exhausted chamber 32, an ion beam IB such as argon ions is emitted from the ion gun IG, and the sample SAM is irradiated with the ion beam IB from the shield plate 2 side in a state in which the processing holder 33 is swung within a range of, for example, ±15 to 40 degrees. A part of the sample SAM protruding (exposed) from the shield plate 2 is processed to obtain a milling surface having a shape along the end face of the shield plate 2 with no stress.

In the first embodiment, problems such as the thermal damage, the redeposition, and the change in the protrusion amount, which occur during the ion milling, are prevented by using the sample holder 1. Therefore, in the sample SAM, the defect such as a shape change or a step generated on a processed surface is reduced. That is, the sample SAM can be processed with a high accuracy in the ion milling device 31 on which the sample holder 1 is mounted.

<Application to Scanning Electron Microscope>

FIG. 10 is a perspective view showing an attachment 41, FIG. 11 is a plan view and a side view showing the attachment 41, and FIG. 12 is a side view showing a state in which the sample holder 1 is installed on the attachment 41. The attachment 41 is a jig for holding the sample holder 1 and is used for the scanning electron microscope.

As shown in FIGS. 11 and 12, the attachment 41 includes a shield plate installation stand 42 formed of a non-magnetic material, and the shield plate installation stand 42 includes a front surface 42f and a back surface 42b opposite to the front surface 42f. The shield plate installation stand 42 is provided with a shield plate fixing portion (protruding portion) 43 protruding from the front surface 42f, a groove 45 recessed from the front surface 42f, and a stage fixing hole 46 penetrating from the front surface 42f to the back surface 42b.

A notch 44 is provided in a part of the shield plate fixing portion 43. The stage fixing hole 46 is provided in a vicinity of a rotation center of the attachment 41. The groove 45 is positioned between the shield plate fixing portion 43 and the stage fixing hole 46. A height of the attachment 41 (a height of the shield plate fixing portion 43) is a height at which the attachment 41 can be inserted into a sample exchange chamber of the scanning electron microscope, and a width of the groove 45 is the same as a width of the shield plate 2 or is slightly larger than the width of the shield plate 2.

As shown in FIG. 12, when the sample holder 1 is installed on the attachment 41, the front surface 2f of the shield plate 2 is brought into contact with the shield plate fixing portion 43, and a part of the shield plate 2 is inserted into the groove 45. The fixing screw 3 is inserted into the notch 44, so that the shield plate 2 is fixed to the shield plate fixing portion 43, and the sample holder 1 is fixed to the shield plate installation stand 42.

When the sample holder 1 is installed on the shield plate installation stand 42, the sample SAM is positioned in a vicinity of a center of the stage fixing hole 46. When the attachment 41 is installed inside the scanning electron microscope, the attachment 41 is fixed by inserting an adjustment screw of the scanning electron microscope into the stage fixing hole 46. Thereafter, the sample SAM can be observed inside the scanning electron microscope.

FIG. 13 is a schematic view showing a scanning electron microscope (charged particle beam device) 51 including the sample holder 1 and the attachment 41.

As shown in FIG. 13, the scanning electron microscope 51 includes an electron gun 52, condenser lenses (electronic lenses) 53, deflection coils (scanning coils) 54, objective lenses (electronic lenses) 55, a stage 56, an adjustment screw 57, and a detector 58. These members are included in one microscope body 59, and the microscope body 59 is also provided with a control circuit for controlling configurations, but illustrations thereof are omitted here. The condenser lens 53 and the objective lens 55 are electromagnets including a coil, and an electromagnetic field generated from each lens functions as a lens that exerts a focusing action on an electron beam EB. The adjustment screw 57 is attached to the stage 56 to protrude from the stage 56 toward an electron gun 52 side.

When the sample SAM that is an observation target is observed, first, the attachment 41 on which the sample holder 1 is mounted is installed on the stage 56 by inserting the adjustment screw 57 into the stage fixing hole 46 from a back surface 42b side of the shield plate installation stand 42. Next, the inside of the microscope body 59 is brought into a vacuum state, and the electron beam EB, which is charged particles, is emitted from the electron gun 52. The emitted electron beam EB is reduced to a specific magnification by the condenser lens 53, scans the sample SAM toward a desired position of the sample SAM by the deflection coil 54, and is focused on the sample SAM as an electron spot by the objective lens 55.

The scanning electron microscope 51 is provided with the detector 58 such as a secondary electron detector, and when the electron beam EB collides with the sample SAM, secondary electrons (particles) generated from the sample SAM are detected by the detector 58. An observation image (SEM image, secondary electron image) is obtained by displaying the amount of the detected secondary electrons (particle)s as brightness on an image processing apparatus or the like electrically connected to the detector 58. The obtained observation image is recorded in a recording device such as a hard disk or a flash memory provided in the scanning electron microscope 51.

In addition to such a detector 58, the scanning electron microscope 51 may be provided with a reflected electron detector for detecting reflected electrons, an X-ray detector for detecting a spectrum of X-rays generated from the sample SAM and performing an elemental analysis of the sample SAM, or the like.

When the sample SAM is processed by using the above ion milling device 31, the sample SAM is processed with a high accuracy, and thus a more accurate observation image can be obtained with the scanning electron microscope 51.

A method of using the sample holder 1 in that case can be roughly summarized as follows. First, a step of holding the sample SAM between the shield plate 2 and the sample supporting member 4 is performed by using the above protrusion amount adjustment jig 21. Next, a step of processing the sample SAM is performed by using the above ion milling device 31. Next, a step of transferring the sample holder 1 from the ion milling device 31 to the scanning electron microscope 51 without separating the sample SAM from the sample holder 1 is performed. Next, a step of observing the processed sample SAM is performed by using the scanning electron microscope 51.

In the related art, it is necessary to remove the sample SAM from the sample holder 1 and re-attach the sample SAM to the sample holder for the scanning electron microscope 51. In the first embodiment, it is unnecessary to remove the sample SAM from the sample holder 1, and such labor can be saved, and thus observation with the scanning electron microscope 51 can be performed more quickly and easily.

The sample holder 1 and the attachment 41 can be applied to samples other than the sample SAM processed by using the ion milling device 31. For example, a sample processed by another method may be mounted on the sample holder 1, followed by installing the sample holder 1 on the attachment 41 and installing the attachment 41 inside the scanning electron microscope 51, and the sample may be observed.

That is, the sample holder 1 can also be used as a member for simply holding a sample for observation in the scanning electron microscope 51. Depending on the observation target, the cooled sample may be observed, or the sample may be observed while being cooled. In any case, in the sample holder 1, the adhesion between the sample SAM and the shield plate 2 is high, and the sample SAM is held by the static stress generated by the pressing members 5 and the dynamic stress generated by the springs 6. Therefore, it is obvious that the sample holder 1 according to the first embodiment is also excellent as a holding member. Therefore, the sample holder 1 can contribute to obtaining a more accurate observation image in the scanning electron microscope 51.

Although the invention has been described in detail based on the embodiment, the invention is not limited to the embodiment described above, and various modifications can be made without departing from the scope of the invention.

REFERENCE SIGN LIST 1 sample holder
2 shield plate (mask member)
2*b* back surface
2*f* front surface
3 fixing screw
4 sample supporting member
4*b* back surface
4*f* front surface
5 pressing member
6 spring (elastic body)
7 sample stand
7*a* shield plate connection portion
7*b* pressing member connection portion
8 plate
9 knob
10 fixing screw
11 screw hole
12 screw hole
13 fixing screw
21 protrusion amount adjustment jig
22 shield plate installation stand
22*b* back surface
22*f* front surface
23 slider
24 micrometer (moving mechanism)
25 notch
26 edge
31 ion milling device
32 chamber (sample chamber)
33 processing holder
34 cooling plate
35 braided wire
36 cooling mechanism (liquid nitrogen)
37 control unit
41 attachment
42 shield plate installation stand
42*b* back surface
42*f* front surface
43 shield plate fixing portion
44 notch
45 groove
46 stage fixing hole
51 scanning electron microscope
52 electron gun
53 condenser lens
54 deflection coil
55 objective lens
56 stage
57 adjustment screw
58 detector
59 microscope body
102 shield plate
103 mask retainer
EB electron beam
IB ion beam
IG ion gun
S1 to S4 step
SAM sample

The invention claimed is:

1. A sample holder used for a charged particle beam device, the sample holder comprising:
a shield plate that includes a first front surface and a first back surface opposite to the first front surface;
a sample stand that is connected to the first back surface of the shield plate;
a pressing member that is configured to move in a first direction perpendicular to the first back surface of the shield plate in a state in which the pressing member is attached to the sample stand, and that has a bar shape;
a sample supporting member that is provided at a position facing the first back surface of the shield plate and is connected to the pressing member; and an elastic body that is provided along an outer circumference of the pressing member and is connected to the sample supporting member and the sample stand.

2. The sample holder according to claim 1, wherein
the two pressing members are provided to be line-symmetrical with respect to a central portion of the sample supporting member, and the elastic body is provided on an outer circumference of each of the two pressing members.

3. The sample holder according to claim 1, wherein
the sample stand includes a first connection portion extending in the first direction and a second connection portion extending in a second direction intersecting the first direction,
the first connection portion is connected to the shield plate, and
the second connection portion is connected to the pressing member and the elastic body.

4. The sample holder according to claim 1, wherein
the shield plate and the sample stand are fixed by a first screw.

5. The sample holder according to claim 4, wherein
two first screw holes are formed in the sample stand,
second screw holes are respectively formed in central portions of four sides constituting the first back surface of the shield plate,
two of the second screw holes, which are provided point-symmetrically with respect to a central portion of the first back surface of the shield plate, communicate with the two first screw holes, respectively, and
the first screw is inserted into the first screw hole and the second screw hole that communicate with each other.

6. The sample holder according to claim 1, wherein
one end portion of the pressing member is connected to the sample supporting member,
the other end portion of the pressing member penetrates the sample stand and is connected to a plate including a knob, and
by moving the knob in the first direction, the sample supporting member, the pressing member, the elastic body, and the plate move in the first direction.

7. The sample holder according to claim 6, wherein
the knob is provided with a second screw that penetrates the plate and the sample stand, and has a length that allows contact with the sample supporting member.

8. The sample holder according to claim 1, wherein
the shield plate, the sample stand, the pressing member, the sample supporting member, and the elastic body are each formed of a non-magnetic material.

9. A protrusion amount adjustment jig configured to mount the sample holder according to claim 1, the protrusion amount adjustment jig comprising:
a shield plate installation stand that includes a second front surface and a second back surface opposite to the second front surface;
a slider that is provided on the second front surface of the shield plate installation stand; and
a moving mechanism that is connected to the shield plate installation stand and is used for moving the slider.

10. A method of adjusting a protrusion amount of a sample, which is performed by using the protrusion amount adjustment jig according to claim 9, the method comprising:
(a) a step of mounting the sample holder on the second front surface of the shield plate installation stand so that the first front surface of the shield plate comes into contact with the second front surface of the shield plate installation stand;

(b) a step of adjusting a distance between the shield plate and the slider by moving the slider using the moving mechanism;
(c) a step of moving the sample supporting member in the first direction and installing the sample between the sample supporting member and the shield plate in a state in which the sample supporting member is separated from the shield plate;
(d) a step of allowing a part of the sample to protrude from the shield plate by bringing an end face of the sample into contact with an end face of the slider; and
(e) a step of moving the sample supporting member so that the sample supporting member comes into contact with the sample, and holding the sample between the sample supporting member and the shield plate.

11. A charged particle beam device, comprising:
the sample holder according to claim 1.

12. The charged particle beam device according to claim 11, further comprising:
an ion gun;
a processing holder that is configured to hold the sample holder;
a cooling plate that is provided on the processing holder and is in direct contact with the first front surface of the shield plate; and
a cooling mechanism connected to the cooling plate.

13. The charged particle beam device according to claim 11, further comprising:
an electron gun;
a stage;
an adjustment screw that is attached to the stage to protrude from the stage toward the electron gun;
a detector; and
an attachment that is configured to hold the sample holder, wherein
the attachment includes a shield plate installation stand including a third front surface and a third back surface opposite to the third front surface,
the shield plate installation stand is provided with a shield plate fixing portion protruding from the third front surface, a fixing hole penetrating from the third front surface to the third back surface, and a groove recessed from the third front surface and positioned between the shield plate fixing portion and the fixing hole,
the shield plate fixing portion is provided with a notch,
the sample holder is fixed to the shield plate installation stand by bringing the first front surface of the shield plate into contact with the shield plate fixing portion, inserting a part of the shield plate into the groove, and inserting a third screw into the notch, and
the attachment is installed on the stage by inserting the adjustment screw into the fixing hole.

14. A method of using a sample holder, the sample holder including: a shield plate that includes a first front surface and a first back surface opposite to the first front surface; a sample stand that is connected to the first back surface of the shield plate; a pressing member that is configured to move in a first direction perpendicular to the first back surface of the shield plate in a state in which the pressing member is attached to the sample stand, and that has a bar shape; a sample supporting member that is provided at a position facing the first back surface of the shield plate and is connected to the pressing member; and an elastic body that is provided along an outer circumference of the pressing member and is connected to the sample supporting member and the sample stand, the method comprising:

(a) a step of holding a sample between the shield plate and the sample supporting member;
(b) a step of processing the sample using an ion milling device;
(c) a step of transferring the sample holder from the ion milling device to a scanning electron microscope without separating the processed sample from the sample holder; and
(d) a step of observing a section of the processed sample using the scanning electron microscope.

* * * * *